United States Patent
Roberts et al.

(10) Patent No.: US 6,932,258 B1
(45) Date of Patent: Aug. 23, 2005

(54) GAMING DEVICE AND METHOD

(75) Inventors: Brian J. Roberts, Carlsbad, CA (US); David B. Petch, La Jolla, CA (US)

(73) Assignee: GTech Corporation, West Greenwich, RI (US)

( * ) Notice: Subject to any disclaimer, the term of this patent is extended or adjusted under 35 U.S.C. 154(b) by 0 days.

(21) Appl. No.: 09/385,336

(22) Filed: Aug. 30, 1999

Related U.S. Application Data (63) Continuation-in-part of application No. 09/238,682, filed on Jan. 26, 1999, now Pat. No. 6,726,077, which is a continuation of application No. 09/128,406, filed on Aug. 3, 1998, which is a continuation of application No. 09/060,423, filed on Apr. 14, 1998.

(51) Int. Cl.[7] .......................... B26F 3/02; B65H 35/10
(52) U.S. Cl. ..................... 225/103; 225/100; 225/105; 463/17; 463/25
(58) Field of Search .................. 83/340, 341, 342, 83/595, 596, 672; 225/5, 100, 4, 103, 104, 225/105, 106; 463/17, 25

(56) References Cited

U.S. PATENT DOCUMENTS

| | | | |
|---|---|---|---|
| 3,888,399 A | 6/1975 | Hanson et al. | 225/106 |
| 4,157,670 A | 6/1979 | Herring | 83/165 |
| 4,454,973 A | 6/1984 | Irvine | 225/100 |
| 4,473,218 A | 9/1984 | Dudek | 225/100 X |
| 4,716,799 A | 1/1988 | Hartmann | 83/42 |
| 4,949,606 A | 8/1990 | Pfeiffer | 83/69 |
| 4,982,337 A | 1/1991 | Burr et al. | 225/100 X |
| 5,119,295 A | 6/1992 | Kapur | |
| 5,133,615 A * | 7/1992 | Saito et al. | 225/106 X |
| 5,158,293 A | 10/1992 | Mullins | |
| 5,160,076 A | 11/1992 | Ford | 225/4 |
| 5,222,624 A | 6/1993 | Burr | 221/1 |
| 5,290,033 A | 3/1994 | Bittner et al. | 463/25 |
| 5,317,135 A | 5/1994 | Finocchio | |
| 5,398,932 A | 3/1995 | Eberhardt et al. | |
| 5,417,424 A | 5/1995 | Snowden et al. | |
| 5,476,190 A | 12/1995 | Herrmann et al. | 221/197 |
| 5,549,233 A | 8/1996 | Clauser | 225/100 |
| 5,657,899 A | 8/1997 | Stoken | |
| 5,713,256 A * | 2/1998 | Keeny | 83/342 X |
| 5,772,510 A | 6/1998 | Roberts | |
| 5,772,511 A | 6/1998 | Smeltzer | |
| 5,836,498 A * | 11/1998 | Turek | 225/100 X |
| 5,853,117 A * | 12/1998 | Traise | 225/100 X |
| 5,862,968 A * | 1/1999 | Traise | 225/100 |
| 5,871,398 A | 2/1999 | Schneier et al. | |
| 5,902,983 A | 5/1999 | Crevelt et al. | |
| 5,979,729 A * | 11/1999 | Schmidt et al. | 225/103 X |

FOREIGN PATENT DOCUMENTS

WO     WO 01/42968     6/2001

* cited by examiner

*Primary Examiner*—Clark F. Dexter
(74) *Attorney, Agent, or Firm*—Kenyon & Kenyon (57) ABSTRACT

A gaming machine is provided for playing several types of games. The winnings from one gave can be used to create credits in the machine for buying tickets in a different game from the same machine. A separator/drive module has a rotary helical separator member which spans multiple channels to separate tickets in any of the channels. A single drive source is the housing rotates the separate drives in each channel.

13 Claims, 8 Drawing Sheets

GAMING DEVICE AND METHOD

This application is a continuation in part of U.S. patent application Ser. No. 09/238,682, filed Jan. 26, 1999, now U.S. Pat. No. 6,726,077, which is a continuation of Ser. No. 09/128,406, filed Aug. 3, 1998 which is a continuation of Ser. No. 09/060,423, filed Apr. 14, 1998.

This invention relates to gaming devices and methods, and particularly to gaming ticket or coupon self-service terminals and methods.

Self-service terminals for selling lottery tickets such as instant-winner or so called "scratch-off" tickets are well known. In addition, different machines have been provided for vending pull-tab lottery tickets.

Other self-service terminals for playing so called "on-line" games, (e.g. Lotto, Keno, Numbers) also have been provided. A typical terminal has a touch-screen for operation, and a reader which reads the number selected by hand by the customer from a form provided for the purpose. Alternatively, the customer instructs the terminal to select a random number. In either case, a printer prints a receipt or ticket which bears the selected numbers and a unique transaction serial number in coded form. The reader can be used later, after the drawing, to read the number on the receipt and indicate whether it is a winner.

Quite often, winnings from any one of such games are of moderate size, and might consist of one or more additional free tickets. In such cases, the player must bother the clerk of the store in which the machine is located to cash one or more low-value tickets, return to the machine to buy more tickets and so forth. It is time wasting for the clerk to handle these transactions, and annoying to the customer.

One of the continuing problems with all gaming ticket or coupon self-service terminals is keeping customer's interest. Accordingly, it is desired to produce such machines in which a variety of games can be played.

Accordingly, it is an object of the present invention to provide a gaming device and method which alleviate the foregoing problems.

In particular, it is an object of the invention to provide a gaming device and method in which several types of gaming tickets can be dispensed from a single terminal.

It also is an object of the invention to facilitate the cashing of winning tickets in such games, and particularly to cash the winning tickets and use them in the same machine for credit toward purchases of other tickets.

Moreover, it is an object of the present invention to provide mechanisms for dispensing tickets in a variety of different enclosures with a certain degree of commonality of parts so as to minimize manufacturing costs.

It is another object of the invention to provide such a device and method in which the tickets are issued with a minimum of opportunities for theft.

It also is an object of the invention to avoid dropping the tickets to be issued into a collecting receptacle, and thus avoiding blockage of the path to such a receptacle.

In accordance with the present invention, the foregoing objects are met by the provision of a self-service ticket vending and issuing machine which accommodates the selling of both instant-winner and pull-tab tickets, and/or lotto or other lottery tickets in a secure, compact, efficient cabinet structure.

In particular, the invention provides for the selling of lotto tickets or tickets in similar games, scratch-off lottery tickets, and pull-tab lottery tickets, all from the same self-service machine.

Also, in accordance with the present invention, a winning ticket from one game can be re-inserted into the machine, where its winning amount is read by a reader, validated and the winning amount is provided as a credit to the player. This credit can be used to buy tickets for another totally different game, or for the same game, as desired. The combination of games in a single machine is synergistic. When a customer has a moderate sized winning from one game, his conversion of those winnings into other tickets is greatly facilitated so as to maximize ticket sales. Also, the store clerk's time is used less, thus freeing him or her to perform other tasks. The customer is better served because converting winners of moderate size into additional tickets is made easier and faster.

Another feature of the invention is the provision of a drive/separator module which can be used in a plurality of different locations and dispensing units with only minor variations. The module includes a housing, a rotary separator member, input and output drive rollers to move tickets into an inlet, past the separator, and out of the housing through an outlet.

A drive system preferably is mounted in the housing for driving the drive rollers, and a drive device also is mounted there to drive the separator member.

Multiple channels side-by-side with one another are operated with a single drive system and single separator mechanism spanning all channels.

A further highly advantageous feature of the invention is the theft-resistant ticket ejector mechanism.

After a ticket or a series of tickets has been separated from the rest of a strip, the ticket is first moved away from the separator, while remaining in the housing, and then is ejected out of the housing by moving it in the opposite direction. Then the trailing edge of the ticket exits the machine first.

This arrangement ensures that no part of the ticket or ticket string extends outside the housing until severance is complete. This prevents thieves from pulling on the ticket end to pull a strip of tickets out of the machine.

In another advantageous feature of the invention, tickets in a strip are moved past a window upwardly, rather than downwardly as in the past. This simplifies the mechanism needed for handling the tickets, and simplifies the loading of tickets in the machine.

GENERAL DESCRIPTION

Figure 1:
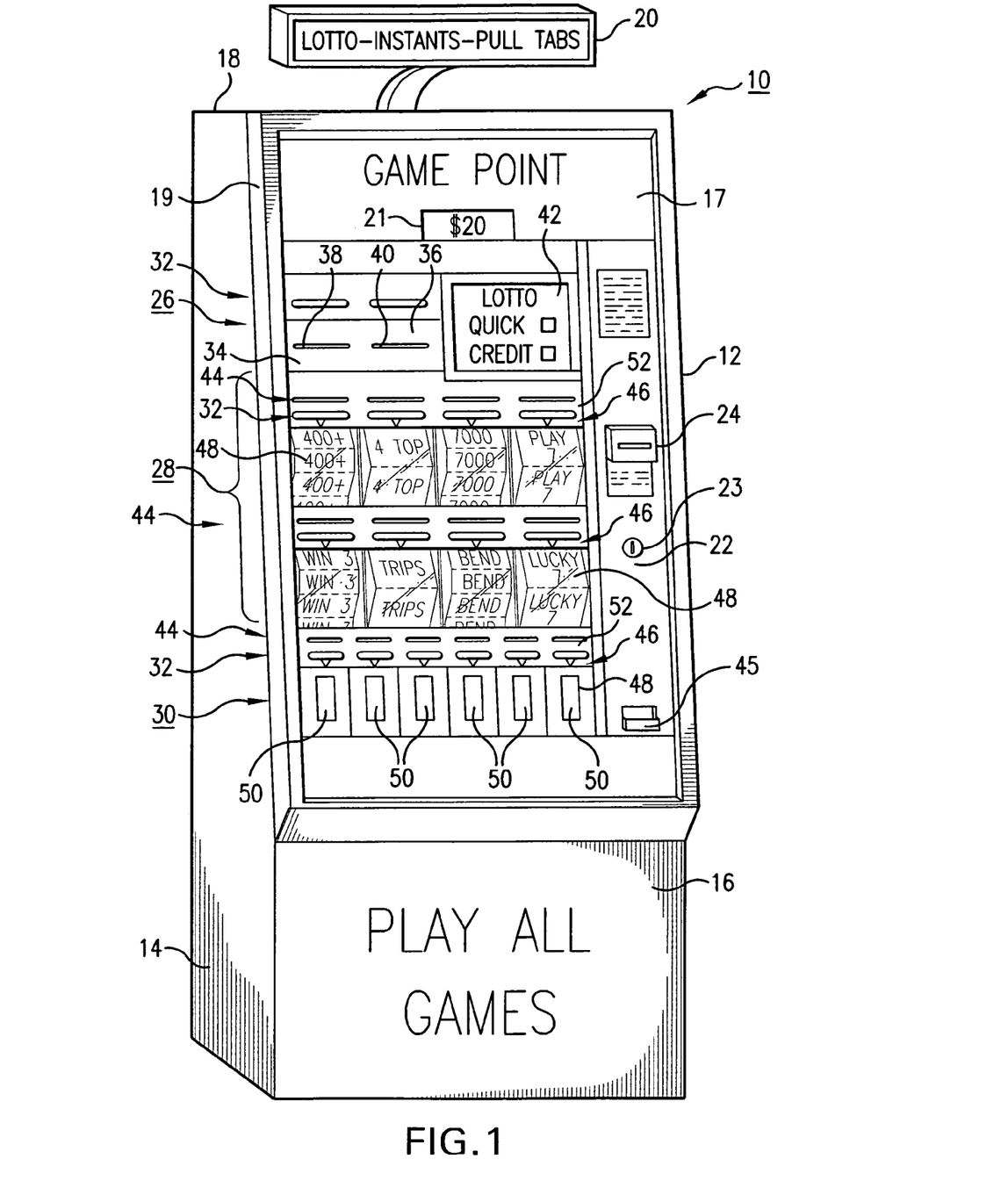
FIG. 1 is perspective view of a gaming device constructed in accordance with present invention.

FIG. 1 shows a self-service terminal 10 constructed in accordance with the present invention. The machine 10 has a sturdy metal housing 12, with side walls 14, front walls 16 and 17, a top wall 18 and bottom and rear walls (not shown).

A display unit 20 is supported above the top 18 of the housing to give messages of interest or advertising with lighted displays. A second display 21 is provided and to display the credit available to the customer using the machine and other operating instructions.

The front door is constructed of two separate door panels 19 and 22. Panel 19 is hinged at one side to the housing using internal hinges, and panel 22 is separately hinged. It overlies part of the door 19 so that panel 22 is opened first to allow the door 19 to be opened. The door panel 19 then can be opened and swung to one side to give access to the dispensers and other components inside for easy refilling and servicing. A lock 23 in the panel 22 is provided to lock the front door.

Mounted in the panel 22 is a bill acceptor 24 which typically accepts one dollar, five dollar, ten dollar and twenty dollar bills. The credit resulting from each deposit is added to the amount of credit on the display 21.

The gaming machine 10 has three different sections 26, 28 and 30.

The first section 26 is the on-line game module, which includes a known lotto play slip reader 34 with an input slot 38 for reading hand-made selections on a lotto play slip, and for reading receipts. Also included is a receipt printer 36 with an outlet slot 40 which issues a receipt or ticket which bears the number selected by the player and a unique transaction serial number in coded form.

Also included in the on-line game module is a touch-screen 42. By touching the screen 42 the user can select a "quick" automatic random selection of numbers made by the machine, in which case the reader is not needed.

Thus, on-line game tickets can be purchased from the machine 10, and the tickets can be re-inserted into the reader 34 after the drawing to determine whether they are winners.

The second section 28 of the machine contains eight different ticket dispensers each of which moves a series of scratch-off instant-winner tickets past a window 48 for dispensing. The tickets are fastened together in strings or sequences in which the tickets are delineated from one another by perforation lines.

Above each dispenser unit is a small display 32 which displays the cost of tickets shown in the window 48 below it.

Also provided just above each dispenser is a push-button 46 to actuate the dispensing of tickets. One push dispenses one separate ticket, and a rapid series of pushes dispenses a string of tickets attached together.

The third and final group of dispensers 30 includes six dispensers for dispensing pull tab tickets 50.

All of the tickets which are dispensed from sections 28 and 30 are dispensed through narrow slots 44 located above the display 5 32.

Preferably, a slot 45 is provided in the wall section 52 of the panel 22 for receiving pull-tab and scratch-off lottery tickets and on-line tickets, if desired. A code reader (not shown in FIG. 1) reads the code on the tickets to determine whether the ticket is a winner, whether it has been previously cashed (by reference to a central computer or storage system where such information is stored), and, if so the winning amount. Such winning tickets are pulled into the machine, marked as "paid" and captured in a safe box for later accounting and audit needs, and the player is given credit for the winning amount so that he or she can use the credit to buy more tickets or play lotto, or one of the other games that can be housed in the machine 10.

The winning tickets that can be thus redeemed includes the winning on-line game tickets (receipts) which are inserted into the reader 34 to be read.

Figure 2:
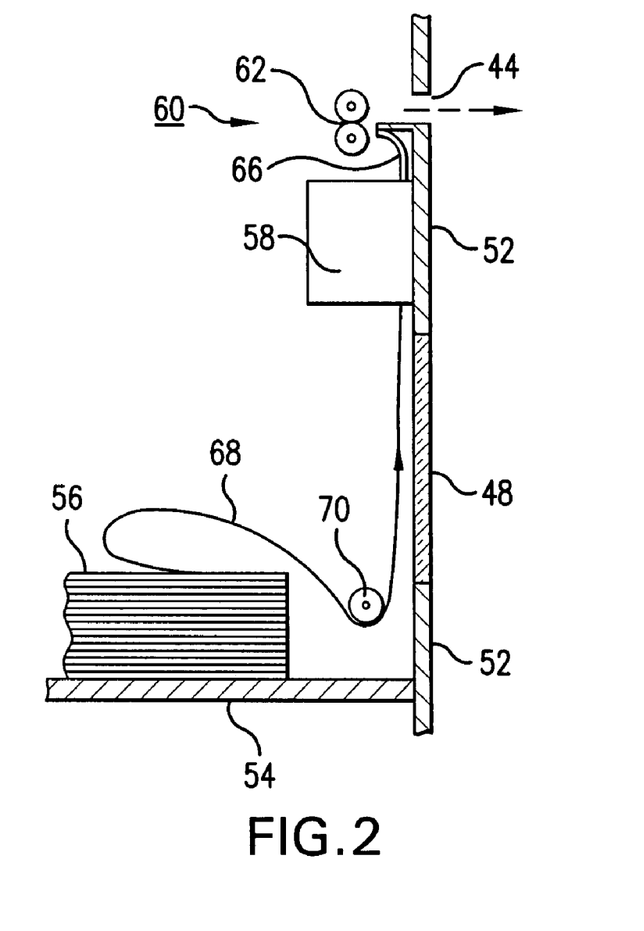
FIG. 2 is a cross-sectional, partially schematic view of a dispensing mechanism used in the machine shown in FIG. 1.
Figure 3:
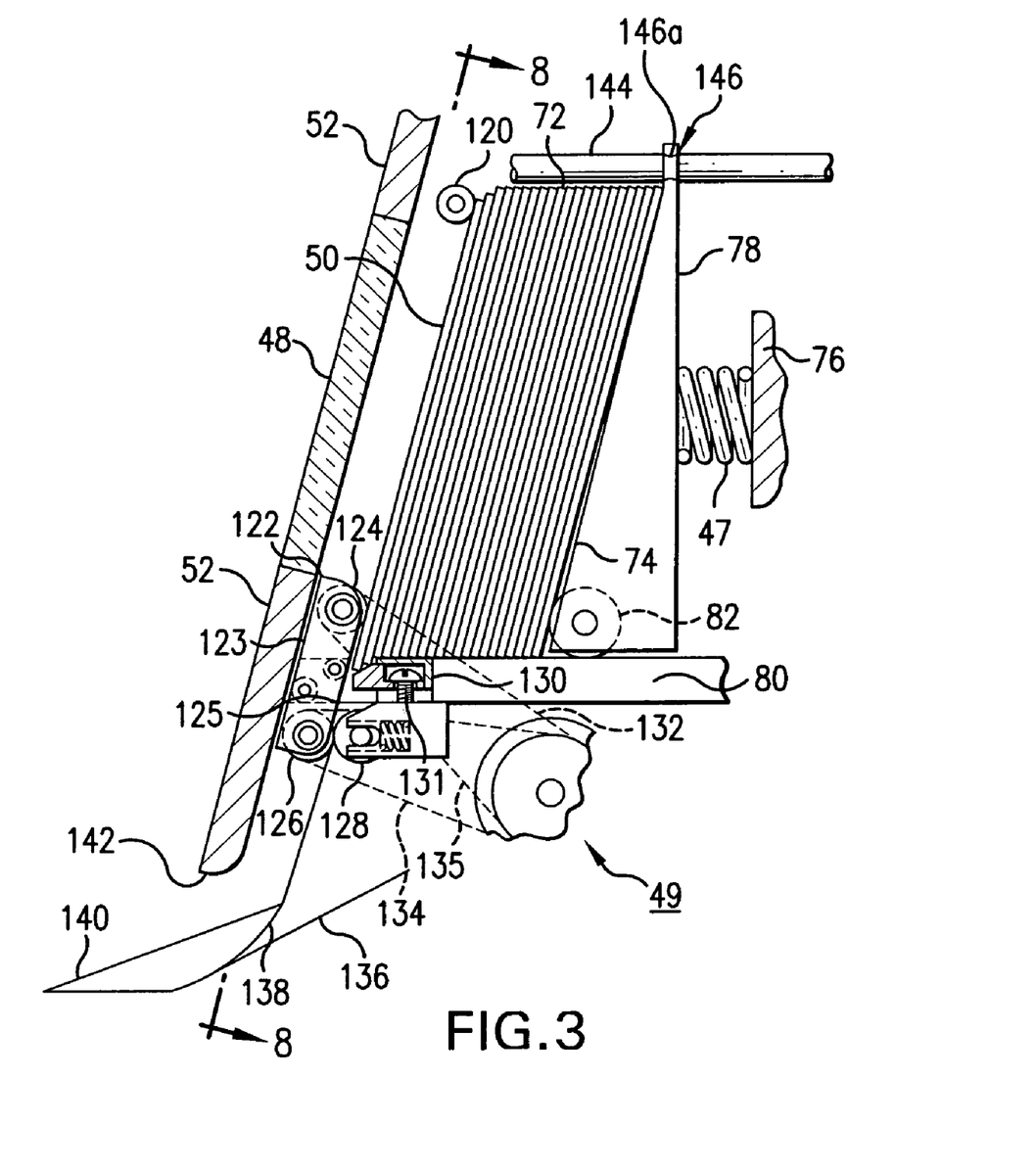
FIG. 3 is a side elevation cross sectional view of another dispensing mechanism used in the machine shown in FIG. 1.
Figure 4:
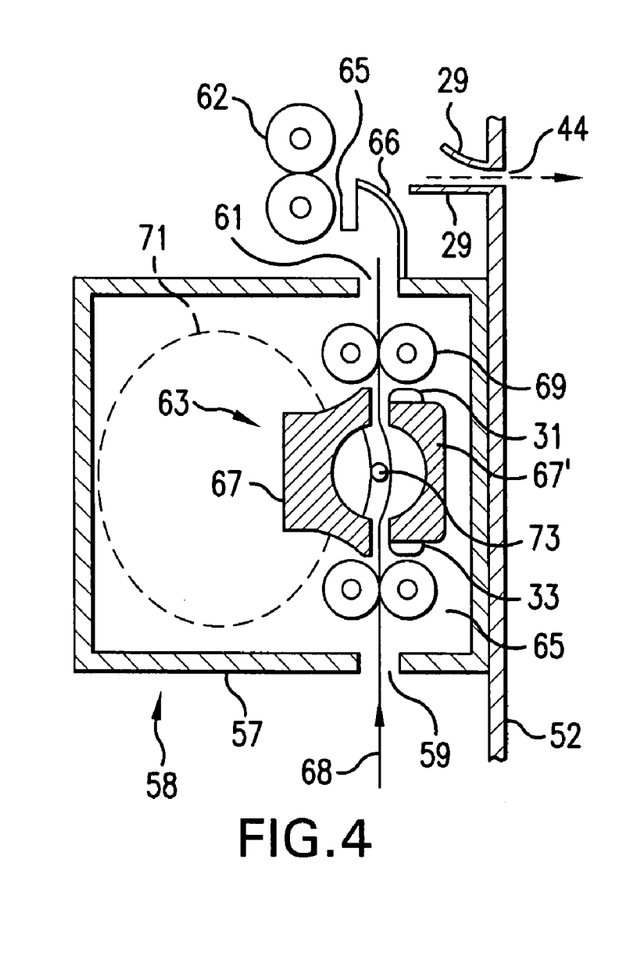
FIG. 4 is a cross-sectional, partially schematic side elevation view of the drive and separator unit of the device of FIG. 1.

It should be noted that, although the windows 48 are shown in FIGS. 2, 3, and 4 as being vertical, they actually are tilted slightly to the left of vertical by about 10° because the front door of the self-service terminal 10 is tilted by that amount. Thus, when the term "vertical" is used in this description, it includes directions approximately 10° or more away from vertical.

Strip Ticket Dispenser

FIG. 2 is a cross-sectional side-elevation schematic view of one of the ticket dispensers shown in FIG. 1. The tickets are arranged in long fan-folded strips in which the tickets are delineated from one another by perforation lines. Typically, such tickets are scratched-off lottery tickets, sometimes referred to as "instant winners".

The dispensing mechanism takes advantage of dispensing structures disclosed in pending U.S. patent application Ser. No. 09/238,682, filed Jan. 26, 1999 and the prior patent applications from which the latter application claims priority and which are identified at the beginning of this patent specification. The disclosures of those applications hereby are incorporated herein by reference.

In particular, a fan-fold stack 56 of tickets formed of a single ticket strip 68 rests on a shelf 54 in the self-service machine housing. The strip extends under an idler roller 70 and upwardly towards a drive and separator unit 58.

Anti-Theft Ejecting Device

The ticket strip 68 is pulled into the unit 58 where either a single ticket or a sequence of tickets is separated from the remaining tickets in the strip, and is pushed upwardly out of the unit 58 into a theft-resistant ejecting device 60 (FIG. 4).

The ejecting device includes a curved guide 66 and a pair of driven rollers 62. The leading edge of the ticket or ticket strip hits the deflector 66 and enters the nip of the rollers 62 which pulls the ticket or strip of tickets to the left until the trailing edge clears the upper edge of the guide 66, and then reverses direction and pushes the ticket or strip through the narrow outlet opening 44, with the trailing edge first.

A photo cell detector 35 is located at the upper edge of the guide 66 and detects the trailing edge of the ticket or ticket string.

The ticket is bent by the guide 66. As the trailing edge moves past the upper edge of the guide 66, the tickets snaps into a horizontal orientation and is driven in reverse towards the outlet 44, and exits the machine trailing edge first.

The outlet 44 is very narrow, say 0.050 inch. To ensure that the ticket is guided through the slot, a guide structure 29 is provided with converging surfaces which guides the edge of the ticket towards the outlet. Also, although the wall 52 (actually, a bezel) is shown schematically as being only sheet metal, it actually is a relatively thick polycarbonate plastic material with converging side walls forming a relatively wide inlet opening of over ¼" width at the inlet to the slot 44.

The rejecting device 60 thus prevents any part of the tickets from exiting from the housing until the separator has separated the tickets from the string. Thus, there is no ticket end extending from the housing upon which a person can pull to withdraw tickets without paying for them.

This arrangement is highly advantageous as compared with some prior ticket dispensing machines in which every ticket is separated from the strip and is dropped into a receptacle for the customer to remove. One advantage is that the ticket cannot become stuck in the passageway to the receptacle. Another is that the ticket is delivered in the proper orientation for easy reading by the customer.

This mechanism is also advantageous relative to such prior art in that it permits the tickets to be issued in strips, as many customers prefer.

Drive/Separator Module

The drive and separating module 58 is shown and described in greater detail in the foregoing copending U.S. patent applications, and particularly in Ser. No. 09/238,682, filed Jan. 26, 1999. However, a summary of the disclosure will be presented here for the sake of completeness in this specification.

Figure 6:
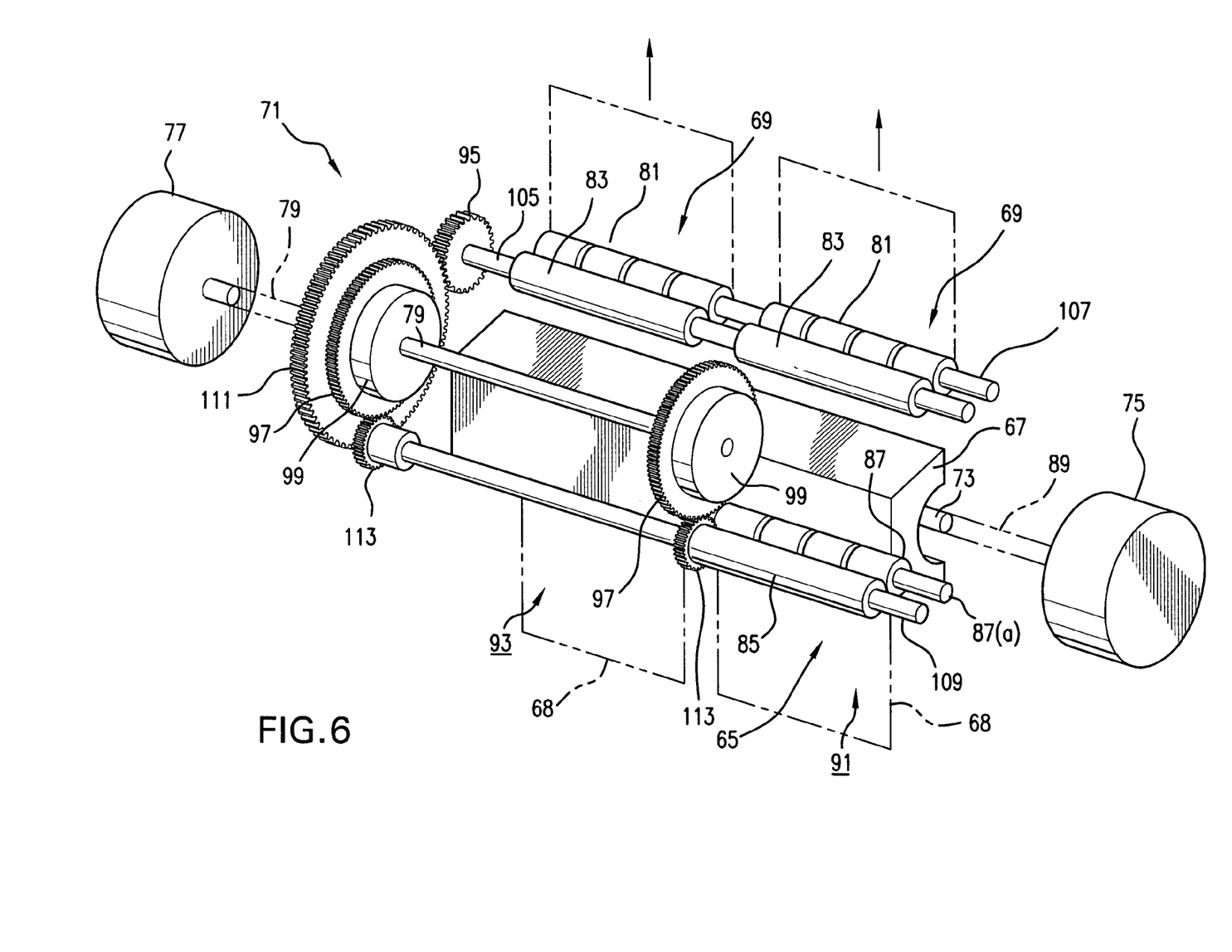
FIG. 6 is a perspective, partially broken—away and partially schematic view of the structure shown in FIG. 4.

Referring now to FIGS. 4 and 6, and first to FIG. 4, the unit 58 includes a housing 57 with an inlet opening 59 and an outlet opening 61 vertically above the inlet opening.

The ticket strip 68 passes between a set of input drive rollers 65, through a separator unit 63 consisting of two extrusions 67 and 67 forming a cylindrical chamber through which the ticket strip passes, and in which a rotatable helical separator member 73 rotates, through a set of output drive rollers 69, and out of the housing 57 through an outlet opening 61.

A drive system is indicated schematically by dashed-line circle 71 in FIG. 4, and is shown in greater detail in FIG. 6.

FIG. 6 is a perspective schematic view of a separator and drive mechanism which has only two channels instead of four, for the sake of simplification of the drawings.

The set of output rollers 69 includes a separate set of idler rollers 81 for each channel, and a drive roller 83 engaged with the idler rollers. Each of the four sets of idler rollers is mounted on a common shaft 107, and each of the drive rollers 83 is secured to a separate common shaft 105.

Similarly, the set of input rollers 65 includes a set of idlers 87 mounted rotatably on a common shaft 87(*a*), and multiple separate drive rollers 85 mounted rotatably on a separate common shaft 109. A small spur gear 113 is secured to each roller 85.

A small spur gear 95 is secured at one end to the shaft 105 and meshes with a large spur gear 111 secured to a drive shaft 79 to rotate the shaft 105 to which each drive roller 83 is secured. Similarly, each of the independent idler rollers 81 rotates freely on a common shaft. Therefore, all of the drive output rollers 83 will rotate when the shaft 79 is rotated.

A drive motor 77, preferably a stepping motor, is provided and is coupled to the shaft 79. A combination of a large spur gear 97 and an electrically-operated clutch 99 is provided for each channel. Each clutch 99 is separately operable to drivably couple the associated spur gear 97 with the drive shaft 79.

When one of the clutches is so operated, the spur gear 97 drives the small spur gear 113 to rotate one of the rollers 85 for one channel to move the ticket strip 68 (shown in dashed outline) through the device.

The leading edge of each ticket or sequence of tickets is detected by photocell detectors 31 and 33. When it is determined, by counting the number of steps taken by the motor 77, that the ticket strip is in a proper position for the separation of one or more tickets from the strip, the drive rollers stop, and a separator drive motor 75 connected through a shaft 89 to the separator member 73 rotates the helical separator member through one revolution and causes one or more tickets to be separated from the strip along a perforated line.

Figure 7:
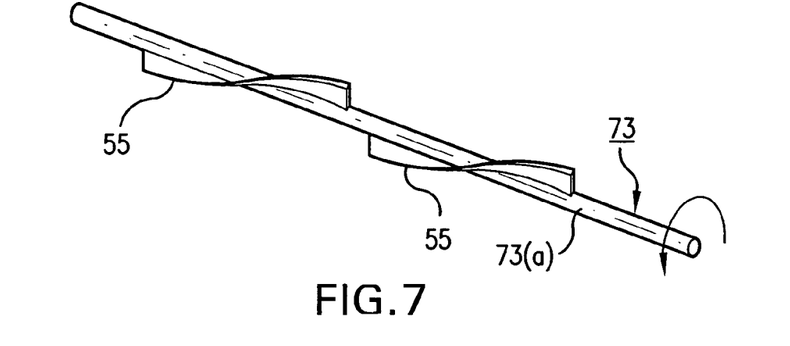
FIG. 7 is a perspective view of the helical separator member of the structure shown in FIGS. 4 and 6.

FIG. 7 is a perspective view showing the separator member 73 with two helical blades 55, one for each of the two channels of the separator mechanism shown in FIG. 6. As it is more fully described in the foregoing copending U.S. Patent Applications, each helical blade 55 extends outwardly from around a shaft 73(*a*) and is secured to the shaft so that the edge of the blade travels through an angle of 180 degrees. The rotation of the shaft causes the tickets to be torn along a perforated line quickly, neatly and reliably.

When the separation operation has been completed, the drive motor again drives the drive rollers 83 which causes the ticket or tickets to be driven upwardly to the ejection device 60, which then ejects the tickets from the machine.

It should be understood that, although the drive/separator module 58 shown in FIG. 4 has a separate housing 57, when used in the self-service terminal shown in FIG. 1, the housing 57 is not needed and preferably is not used.

It is notable that four channels, six channels and even more can be driven with a single drive motor and a single separator motor, thus significantly reducing the complexity, size and cost as compared with prior separator systems.

Pull-Tab Ticket Dispensing

Figure 8:
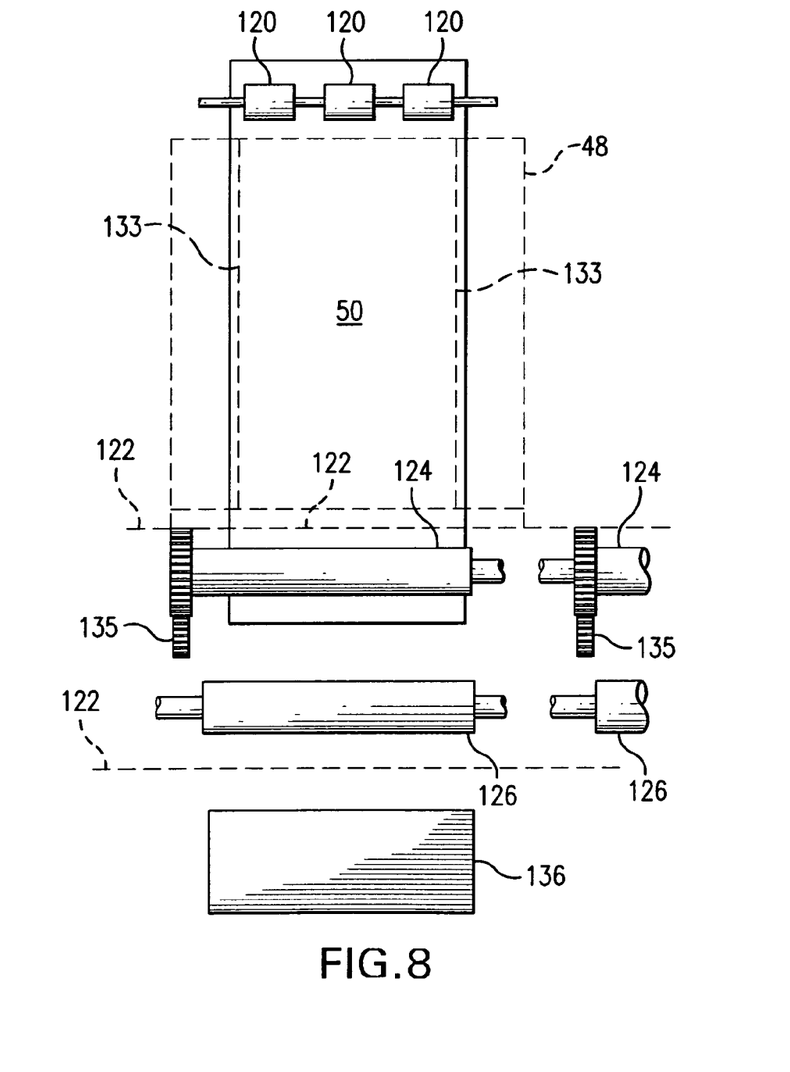
FIG. 8 is a front elevation view, partially schematic, taken along line 8—8 of FIG. 3.

FIGS. 3 and 8 show one embodiment of the pull-tab ticket dispenser of the invention. This dispenser differs from the showing of FIG. 1 primarily in that tickets 138 and 140 are delivered into a chute or receptacle 136 located below the window 48 instead of through an outlet above the window 48.

The window 48 and the front of the self-service terminal, as well as a stack 72 of pull-tab tickets are inclined, at a substantial angle (e.g., 10° to 15°) away from vertical.

The tickets in the stack 72 are stacked on edge with their longest dimension extending vertically (See FIG. 8) on a support surface 80. A pusher 78 with an inclined front face 74 is urged towards the left in FIG. 3 by means of a compression spring 47 urging the pusher from the rear and pressing against a solid portion 76 of the dispensing machine. The pusher 78 has a vertical extension 146 with a hole 146(*a*). A horizontal guide rod 144 extends above the stack 72 and through the hole 146(*a*) in the extension 146. The guide rod 144 guides the pusher 78 in its travels towards and away from the window 48.

The ticket stack 72 is urged into contact with an idler roller 120 near the upper edge of the stack, and a drive roller 124 located near the bottom of the stack.

A second drive roller 126 bearing against a spring-biased idler roller 128 is provided to eject the ticket into the chute 136.

The rollers 124 and 126 are mounted in a mounting block 122 which has a surface 125 against which the tickets bear during dispensing. A known "ticket knife" structure 130 is provided to set the dimensions of the gap between the left edge of the ticket knife and the surface 125 by loosening the screw 131 and moving the knife body to the left or right, and re-tightening the screw. A drive motor and clutch system 49 like that shown in FIG. 4 is provided to drive the ticket-dispensing rollers 124 and 126 in each of the six pull-tab channels in the machine. Each of the rollers 124 is driven only when one of the six clutches is energized, and the output rollers 126 are driven whenever the drive motor rotates.

Operation of the dispenser of FIGS. 3 and 8 is as follows:

The tickets at the front of the stack slide downwardly under the force of gravity to rest on the downwardly sloping left portion on the "knife" 130.

When one of the clutches for one of the channels is energized, the drive roller 124 grips the front ticket 50 and sends it past the knife 130 into the nip of the rolls 126, 128 which feed the ticket downwardly.

The ticket 138 bends slightly when it contacts the chute 136, and then straightens out, as shown at 140 when it rests, in the chute, ready to be grasped by the customer.

The pusher plate 78 pushes the stack to the left to bring the next ticket into dispensing position.

The pusher 78 rides on a wheel 82 which rolls on the surface of the support 80. The wheel also protrudes forwardly of the front surface 74. Thus, the force of the pushing spring 47 is concentrated in the vicinity of the wheel 82 and this maximizes the pressure on the roller 124 to give it a good grip on the lead ticket 50. This helps to ensure that the tickets will be separated from one another if they are stuck together.

The spring 47 preferably is replaced by one or a pair of "continuous" springs and pulleys which are better adapted for relatively lengthy travel paths, but is shown as a compression spring for the sake of simplicity in the drawings.

Figure 10:
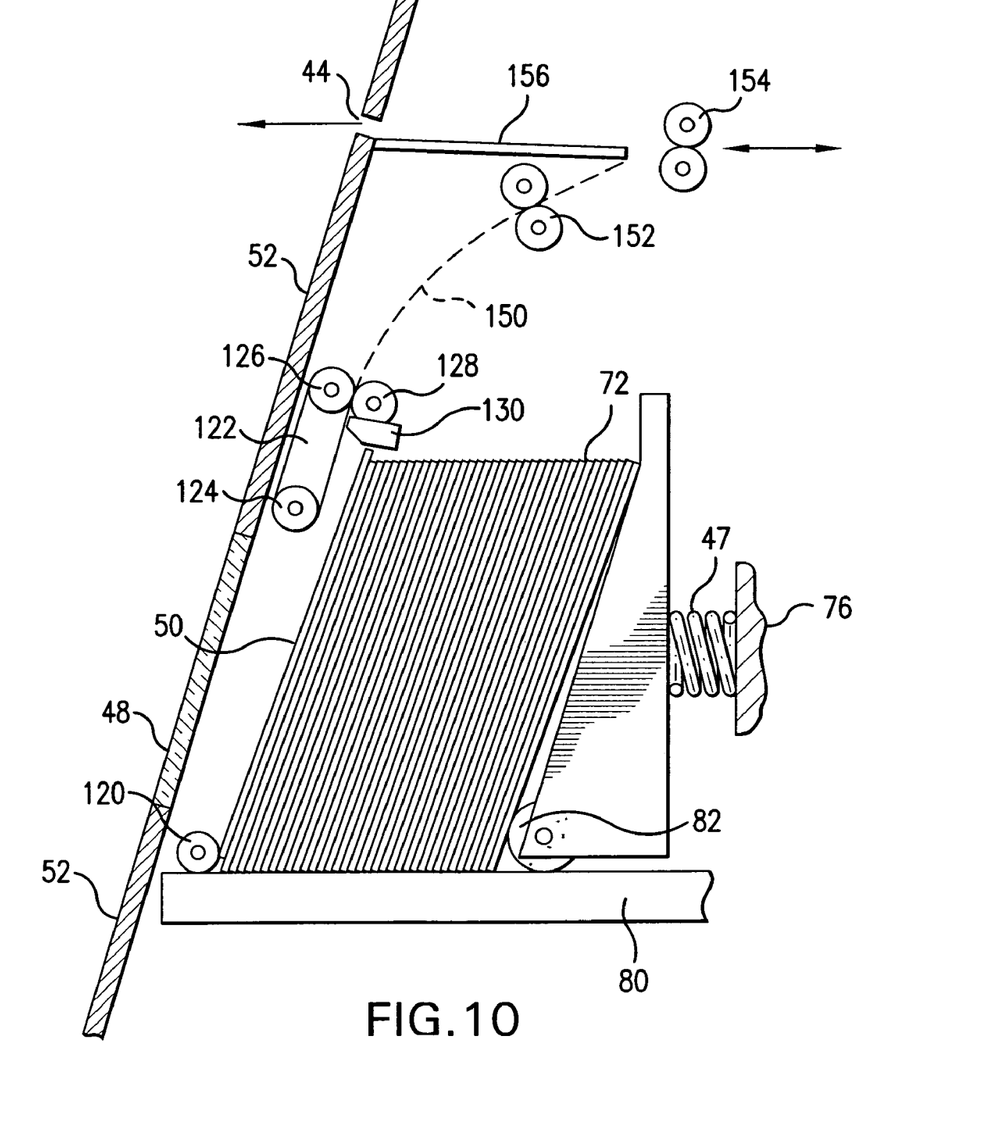
FIG. 10 is a cross-sectional view of another dispensing mechanism of the invention.

FIG. 10 is a schematic representation of an alternative embodiment of the pull-tab dispensing mechanism. It is very similar to the one shown in FIGS. 3 and 8, except that the positions of the rollers 120 and 126, 128 are reversed and the ticket knife 130 is at the top of the stack 72 and the tickets are ejected upwardly instead of downwardly. The tickets are driven along a gently curved path 150 through a pair of feed rollers 152 and into the nip of a pair of reversing rollers 154.

Rollers 154 drive the ticket first to the right, until the trailing edge of the ticket is detected by a photocell (not shown in FIG. 10), at which point the rollers reverse direction and push the ticket to the left along a guide 156 and through the outlet 44, which is above the window 48, as shown in FIG. 1.

Another embodiment of the pull-tab ticket dispenser is illustrated diagrammatically in FIG. 8. A pair of thin elastomeric belts and pulleys are located near the vertical edges of the ticket 50 at 133. These belts are driven to push the ticket 50 either upwardly or downwardly instead of the rollers 124, 126, etc. shown in FIGS. 3, 8 and 10.

Figure 9:
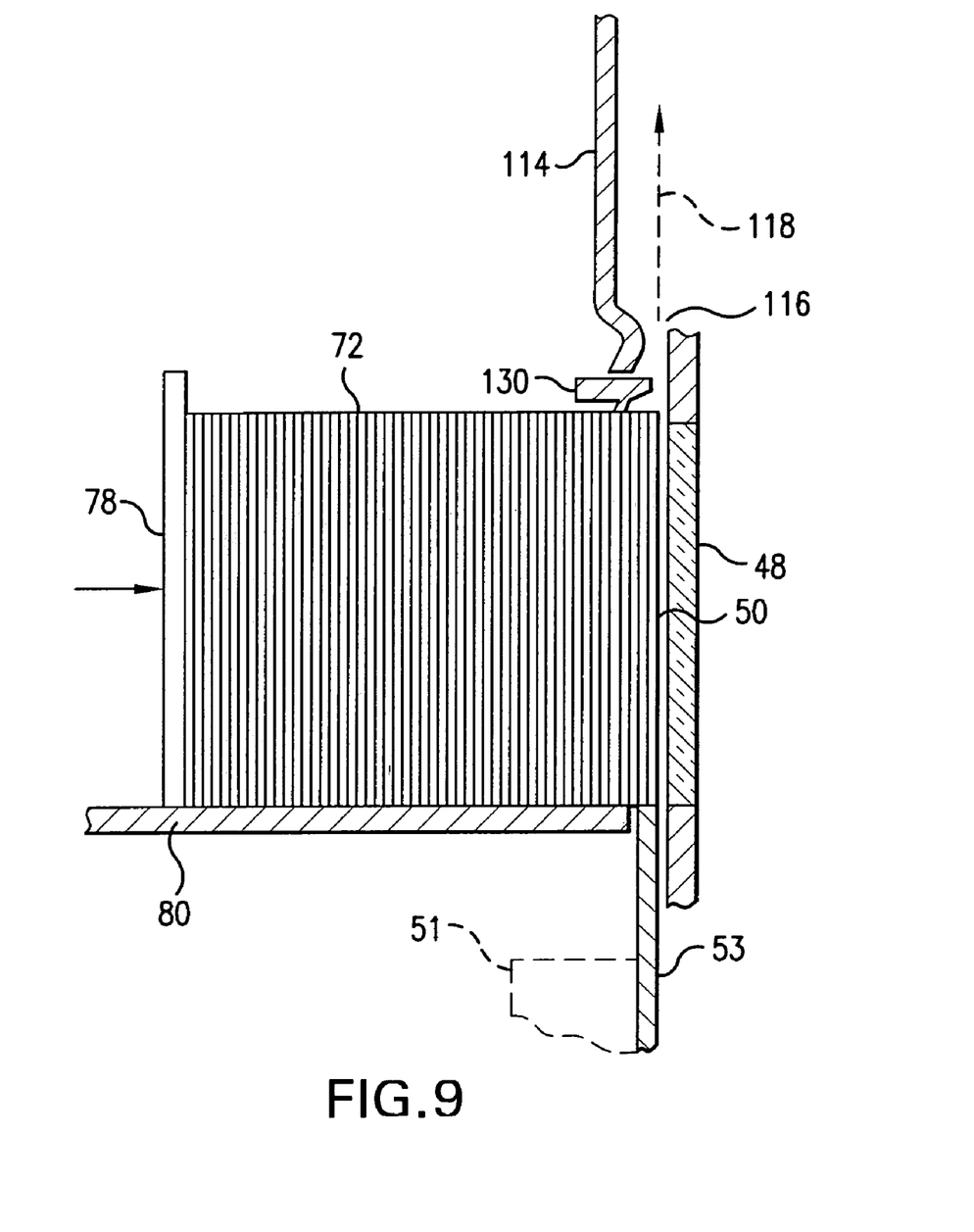
FIG. 9 is a schematic side elevation view of an alternative embodiment of the dispenser shown in FIG. 3.

Another alternative embodiment is shown in FIG. 9 in which the lead ticket 50 is pushed upwardly through a slot 116 in a short horizontal portion of a recess 114 in the front panel of the self-service terminal. The ticket is pushed upwardly and out of the machine along the path 118 directly by the pusher plate 53, thus reducing the size and complexity of the dispensing mechanism and preventing the bending of the tickets.

This mechanism can also drive the tickets in a downward direction to dispense the next ticket and drop it into a receptacle.

With all of the foregoing mechanisms, the customer is allowed to see the face of the pull tab ticket and watch it move upwardly or downwardly as it is being dispensed from the machine. This adds interests and reassurance to the customer in knowing what he or she is about to receive.

Lotto Gaming Equipment

Figure 5:
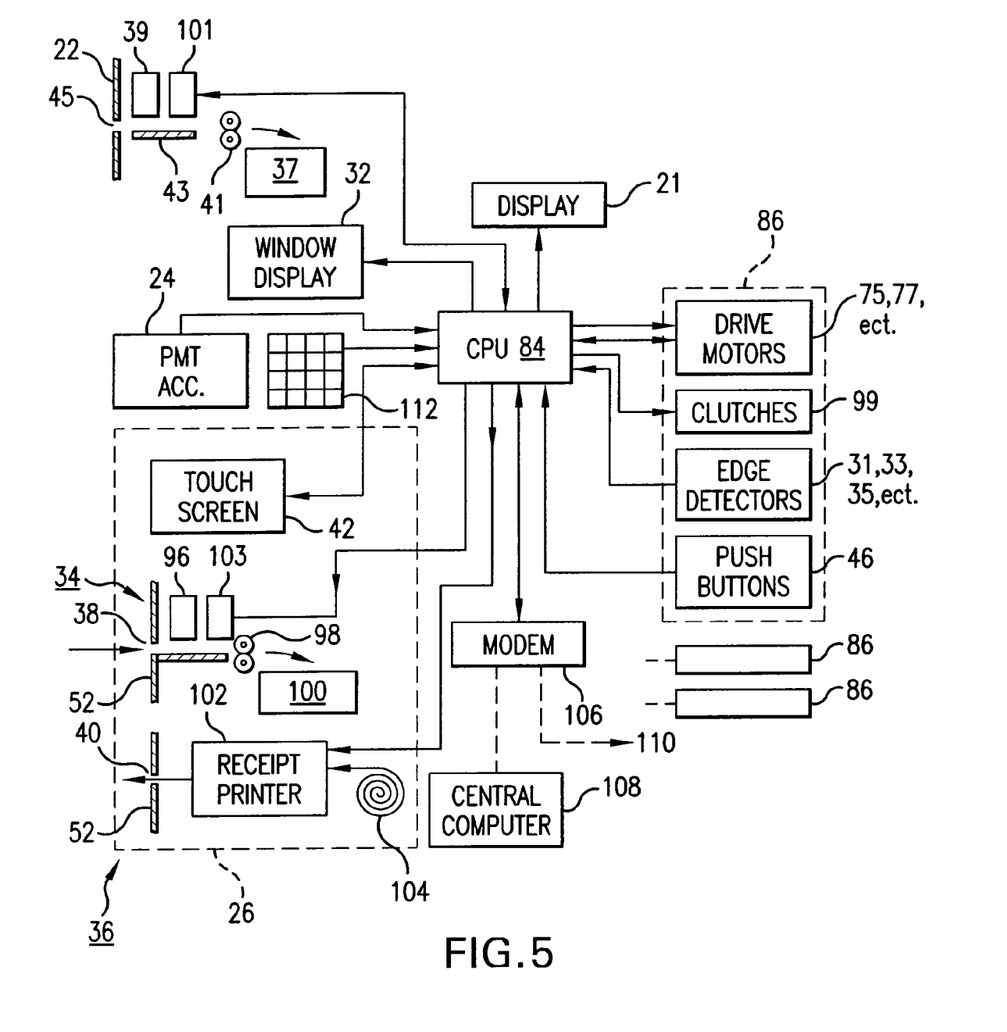
FIG. 5 is schematic circuit diagram illustrating the operating system of the present invention.

FIG. 5 shows the on-line game module 26 schematically. This module is basically the same as that currently manufactured and sold by G-Tech, Inc. and used in a self-service terminal. The module/equipment 26 includes a card reading device 96 for reading a lotto card filled out by hand and inserted into the slot 38. If the correct fee has been paid, the device 96 reads the markings representing the selected numbers from the card. The card is ejected after reading so that the player can use it in a subsequent drawing.

A receipt (ticket) is printed by means of a receipt printer 102 using paper from a roll 104, and the receipt is issued through the outlet opening 40 in the front panel 52 of the housing of the machine.

As it is well-known, this equipment has the feature whereby the printed receipt bears the selected numbers and a unique transaction number in a code readable by the reader 96. At a later time, after the drawing, the receipt can be inserted into the slot 38 to be read by the reader 96 to determine whether the ticket is a winner, and the display (21) or display of the touch-screen 42, if used, will give the customer the good or bad news, i.e. win or lose.

As noted above, and as it is shown in FIG. 1, the customer can touch a selected area on the screen and select the "quick-pick" option whereby the machine itself makes a random selection of a number for the customer or by use of the touch-screen the customer may select his/her own numbers. In this case, a hand-filled out card is not necessary and a receipt is issued by the receipt printer promptly after the number(s) has been selected.

All of these elements of the unit 26 are integrated into the module housing as shown in FIG. 1.

The display 21 displays the amount of credit available corresponding to the amount of cash input to the machine by the customer. As the tickets (including on-line game receipts) are issued, the balance decreases automatically until exhausted.

Control System

FIG. 5 is a schematic circuit diagram of the control system of the machine shown in the other figures of the drawings.

The control system includes a microprocessor 84 suitably programmed to perform the following functions.

Each horizontal row of ticket dispensers in sections 28 and 30 (FIG. 1) has a control unit 86 consisting of drive motors 75 and 77, or drive motors or solenoids for the pull-tab dispensers and ejector rollers 62, etc. clutches 99; edge detectors 31, 33, 35, etc.; and push-buttons 46. The microprocessor 84 accepts signals from the push buttons 46, payment acceptor 24, and the edge detectors 31, 33, 35, etc. to operate the clutches 99 and the drive motors, to move the tickets, to operate the separator mechanisms, and eject the tickets as described above. Separate circuits 86 essentially the same as the one shown are included, each for a separate row of dispensers.

A keypad 112 is provided inside in the machine for use by service representative to change the price display 32, if necessary, and otherwise initialize the microprocessor 84 when reloading the machine with tickets, in a well-known manner.

The message advertising displayed on the overhead display unit 20 is either programmed remotely from a central computer 108 through a modem 106, or is predetermined by other means such as the key pad 112. The credit available to the customer is displayed on the display unit 21, and is increased or decreased by the micro-processor.

As is it well known in the art, a modem 106 conveys information regarding the identification number of the tickets sold, and the winning amount of the ticket, if it is a winner, and other information to a central computer 108 so that the computer 108 is continuously informed as to which tickets have been sold and the winning amounts.

A connection, indicated at 110, can be made to the world wide web to display information from the lottery system website during times between transactions.

Winner Credit Feature

In accordance with one feature of the present invention, winners from any of the several games sold in the machine 10 can be exchanged for credit towards the purchase of more tickets from the same machine.

In general, the way this is accomplished is that a bar-code, OCR or other type of reader 39 (FIG. 5) is positioned in the machine behind the slot 45 (see FIG. 1). The winning ticket is inserted into the slot 45 on a support 43, and the unique transaction number (ticket number) is read by the reader 39. The micro-processor 84 checks with the central computer 108 to see if the ticket is a winner. If so, the winning amount is posted as a credit towards purchase of plays in the same game or other games, and the ticket is drawn in by a drive roller pair 41 and deposited in a catch-bin 37 where it is retained. Also, a printer 101 (FIG. 5) can be provided to mark the ticket "PAID".

If the ticket is not a winner, it is returned to the customer by reverse rotation of the rollers 41.

Referring to FIG. 5, the reader 96 of the lotto system 26 already is adapted to read the number from the receipt/ticket inserted into the slot 38. The microprocessor 84 simply is enabled to credit the amount of a winning ticket to the credits available to the player when the player presses the "credit" area on the touch screen 42 (see FIG. 1). The amount of the winnings is credited and displayed on the display 21, and can be used for purchasing more on-line game or instant winner tickets, as desired.

If the ticket is detected to be a winner and the credit is given to the player, then the ticket is pulled into the machine by drive roller pair 98 and deposited in the bin 100 so that the player will not attempt to cash the same ticket again. Also, a printer 103 can be used to mark the ticket "PAID". If it is not a winner, it is returned by reversing the direction of rollers 98.

Instead of the player having to bother a clerk to give the player another free ticket, or two dollars or five dollars cash for a winning ticket, and then return to the machine to buy more tickets, if he or she so desires, the player can conveniently convert the winnings into more tickets. The result is higher ticket sales, lower labor usage, and better convenience for the player and the store owner.

If the amount of winnings for the ticket exceeds a certain maximum level, say twenty dollars, the player still will be required to cash the ticket through the clerk. Of course, this upper limit can be adjusted as necessary, as long as the upper limit of the amount of credit that can be displayed on the display 21 is sufficiently high.

It should be understood that the invention is not limited to a machine that plays only three games; rather, the invention applies to machines offering at least two, and more than three games as well.

Also, a player may cash out winning credits displayed on display 21 by pressing a "Payout" button either on the touch-screen or else where. Upon receipt of the Payout signal the system will print, via printer 102, a Payout ticket which the customer will present to the retailer for payment in the same manner as the payment for a winning ticket. The same can be done using the printer 101 for the tickets it prints.

Additional games similar to lotto can be played in the machine instead of or in addition to lotto. For example, keno, "pick three", "pick four" and other such games also can be played using the on-line game equipment 26.

Another variation of the invention is one in which non-completed lottery tickets each having a blank region adapted for receiving printed information necessary to complete the ticket can be dispensed from the machine rather than completed tickets. Such tickets are those, for example, described in U.S. Pat. No. 5,772,510.

In this case, the non-completed ticket is inserted into the terminal or dispensed from a fan-fold pack or rolls, and the central computer 108 supplies information to the terminal to complete the ticket, and a printer prints the information on the ticket blank. The completed ticket then can be played and cashed in the manner described above, or by a clerk, if it is a winner.

The above description of the invention is intended to be illustrative and not limiting. Various changes or modifications in the embodiments described may occur to those skilled in the art. These can be made without departing from the spirit or scope of the invention.

What is claimed is:

1. A multi-game ticket self-service terminal comprising:
   a housing for storing a plurality of different types of game tickets, said types including lottery tickets stored in strips in which individual tickets are delineated from one another by lines of weakness;
   a currency acceptor device mounted in said housing to accept currency and produce a corresponding number of credits;
   credit display means in communication with the currency acceptor device and mounted in the housing for displaying the number of credits;
   dispensing means for selectively dispensing said tickets according to the number of credits;
   detector means for detecting a winning amount displayed on a ticket previously dispensed from the dispensing means; and
   credit means for increasing the number of credits corresponding to the winning amount;
   wherein the dispensing means further comprises a separator mechanism for separating tickets from one another before being guided out of said housing, said separator mechanism including at least one rotary dull helical separator member, at least one detector mounted in said housing for detecting the position of said tickets and a drive device mounted in said housing and coupled to the separator member to selectively rotate said separator member to separate said tickets.

2. A multi-game ticket self-service terminal comprising:
   a housing for storing a plurality of different types of game tickets, said types including lottery tickets stored in strips in which individual tickets are delineated from one another by lines of weakness;
   a currency acceptor device mounted in said housing to accept currency and a produce a corresponding number of credits;
   credit display means in communication with the currency acceptor device and mounted in the housing for displaying the number of credits;

dispensing means for selectively dispensing said tickets according to the number of credits;

detector means for detecting a winning amount displayed on a ticket previously dispensed from the dispensing means; and credit means for increasing the number of credits corresponding to the winning amount;

said dispensing means including a plurality of dispensing mechanisms, each including a separator/drive module, said module comprising a drive housing, inlet and outlet openings in said drive housing, a dull rotary separator member rotatably mounted in said drive housing and positioned to axially extend across a ticket strip dispensing path for extending across one of said strips when a strip is in a position for dispensing, a first ticket drive device in said drive housing between said inlet opening and said separator member to move said strip to a separation location, and a second ticket drive device mounted adjacent said separator member for moving at least one ticket away from said separator member and through said outlet opening.

3. A self-service terminal as in claim 2 in which said ticket types include instant-winner pull-tab tickets stored in stacks of separate tickets.

4. A combination comprising:
(a) a plurality of different types of game tickets, said types including lottery tickets stored in strips in which individual tickets are delineated from one another by lines of weakness;
(b) a multi-game ticket self-service terminal comprising:
(1) a housing for storing the plurality of different types of game tickets;
(2) a currency acceptor device mounted in said housing to accept currency and produce a corresponding number of credits;
(3) credit display means in communication with the currency acceptor device and mounted in the housing for displaying the number of credits;
(4) dispensing means for selectively dispensing said tickets according to the number of credits;
said dispensing means including a plurality of dispensing mechanisms, each including a separator/drive module, said module comprising a drive housing, inlet and outlet openings in said drive housing, a dull rotary separator member rotatably mounted in said drive housing and positioned to axially extend across a ticket strip dispensing path for extending across one of said strips when a strip is in a position for dispensing, a first ticket drive device in said drive housing between said inlet opening and said separator member to move said strip to a separation location, and a second ticket drive device mounted adjacent said separator member for moving at least one ticket away from said separator member and through said outlet opening;
(5) detector means for detecting a winning amount displayed on a ticket previously dispensed from the dispensing means; and
(6) credit means for increasing the number of credits corresponding to the winning amount.

5. The combination of claim 4 in which said ticket types include instant-winner pull-tab tickets stored in stacks of separate tickets.

6. A combination comprising:
(a) a strip of tickets in which individual tickets are delineated from one another by lines of weakness;

(b) a separator/drive module for driving and separating at least one of the tickets from an adjacent ticket in the strip, the module comprising:
(1) a housing;
(2) an inlet opening and an outlet opening in said housing;
(3) a dull rotary separator member rotatably mounted in said housing and positioned across a ticket strip dispensing path to span said strip and axially extend in a direction generally transverse to said strip when said strip is in position for separation;
(4) a first ticket drive device in said housing between said inlet opening and said separator member to move said strip to a separation location;
(5) a second ticket drive device mounted in said housing for moving at least one ticket away from said separator member and through said outlet opening; and
(6) a controller in the housing and operably coupled to the first and second ticket drive devices to inactivate the drive devices and hold the ticket strip stationary during rotation of the rotary separator member to separate at least one of the tickets from the strip.

7. The combination of claim 6 in which said separator member has a shaft with a dull helical projection extending therefrom, and including a drive motor mounted in said housing and coupled to said shaft to selectively rotate said shaft to separate tickets in said strip.

8. The combination of claim 6 wherein the separator/drive module has only one rotary separator member.

9. The combination of claim 6 wherein the rotary separator member is mounted for rotation about an axis generally transverse to the ticket strip dispensing path.

10. A separator/drive module for driving and separating tickets from a strip of tickets in which individual tickets are delineated from one another by lines of weakness, said module comprising: a housing, inlet and outlet openings in said housing, a dull rotary separator member rotatably mounted in said housing and positioned across a ticket strip dispensing path to span said strip and axially extend in a direction generally transverse to said strip when said strip is in position for separation, a first ticket drive device in said housing between said inlet opening and said separator member to move said strip to a separation location, and a second ticket drive device mounted in said housing for moving at least one ticket away from said separator member and through said outlet opening, and
a controller in the housing and operably coupled to the first and second ticket drive devices to inactivate the drive devices and hold the ticket strip stationary during rotation of the rotary separator member to separate at least one of the tickets from the strip.

11. The module of claim 10 wherein the separator/drive module has only one rotary separator member.

12. The module of claim 10 wherein the dull rotary separator member is mounted for rotation about an axis generally transverse to the ticket strip dispensing path.

13. The module of claim 10 in which said separator member has a shaft with a helical projection extending therefrom, and including a drive motor mounted in said housing and coupled to said shaft to selectively rotate said shaft to separate tickets in said strip.

* * * * *